(12) United States Patent
Watanabe et al.

(10) Patent No.: US 8,384,373 B2
(45) Date of Patent: Feb. 26, 2013

(54) AC LINE SIGNAL DETECTION DEVICE AND METHOD AND POWER SUPPLY DEVICE

(75) Inventors: Hiroyuki Watanabe, Kanagawa (JP); Yasushi Katayama, Kanagawa (JP); Masaya Uemura, Tokyo (JP)

(73) Assignee: Sony Corporation, Tokyo (JP)

( * ) Notice: Subject to any disclaimer, the term of this patent is extended or adjusted under 35 U.S.C. 154(b) by 428 days.

(21) Appl. No.: 12/659,788

(22) Filed: Mar. 22, 2010

(65) Prior Publication Data

US 2010/0284207 A1  Nov. 11, 2010

(30) Foreign Application Priority Data

May 8, 2009  (JP) .................................. 2009-113888

(51) Int. Cl.
  *G01R 19/00* (2006.01)
  *G01R 1/38* (2006.01)
(52) U.S. Cl. ........ 324/115; 327/74; 324/119; 324/76.11
(58) Field of Classification Search .................. 324/115, 324/119, 76.11, 120; 327/1, 2, 13, 39, 50, 327/88; 320/130, 134, 135, 136, 132
See application file for complete search history.

(56) References Cited

U.S. PATENT DOCUMENTS

| | | | | |
|---|---|---|---|---|
| 5,502,374 A | * | 3/1996 | Cota | 324/127 |
| 5,859,756 A | * | 1/1999 | Pressman et al. | 361/90 |
| 5,917,319 A | * | 6/1999 | Frank et al. | 324/76.11 |
| 5,929,663 A | * | 7/1999 | Dougherty | 327/101 |
| 6,519,537 B1 | * | 2/2003 | Yang | 702/58 |
| 6,541,954 B1 | * | 4/2003 | Gluszek | 324/107 |
| 6,552,526 B1 | * | 4/2003 | Statovici et al. | 324/750.01 |
| 6,690,142 B2 | * | 2/2004 | Hendrix | 323/222 |
| 7,492,166 B2 | * | 2/2009 | DeVore | 324/654 |
| 7,589,514 B1 | * | 9/2009 | Fernald | 324/76.11 |
| 2010/0283512 A1 | * | 11/2010 | Acharya et al. | 327/101 |

* cited by examiner

*Primary Examiner* — Edward Tso
*Assistant Examiner* — Alexis Boateng
(74) *Attorney, Agent, or Firm* — Rader, Fishman & Grauer PLLC

(57) ABSTRACT

Disclosed herein is an AC line signal detection device including: a semiconductor integrated circuit; and a conversion section adapted to rectify an AC line signal and convert the rectified signal to an input signal to be fed to the semiconductor integrated circuit, wherein the semiconductor integrated circuit includes a monitoring section adapted to divide the AC line signal into a plurality of voltage ranges with at least one reference voltage proportional to the amplitude of the AC line signal to monitor within which voltage range the AC line signal falls; a measuring section adapted to measure a duration for which the AC line signal remains in each of the voltage ranges; and a determination section adapted to determine, based on the monitoring result of the monitoring section and the measurement result of the measuring section, whether the duration for which the AC line signal remains in each of the voltage ranges exceeds a set time which can be set in advance to make a pass/fail determination on the AC line signal.

18 Claims, 11 Drawing Sheets

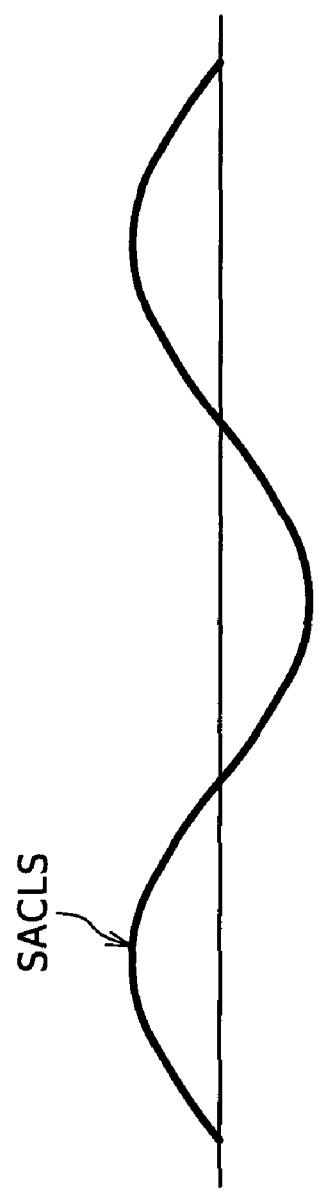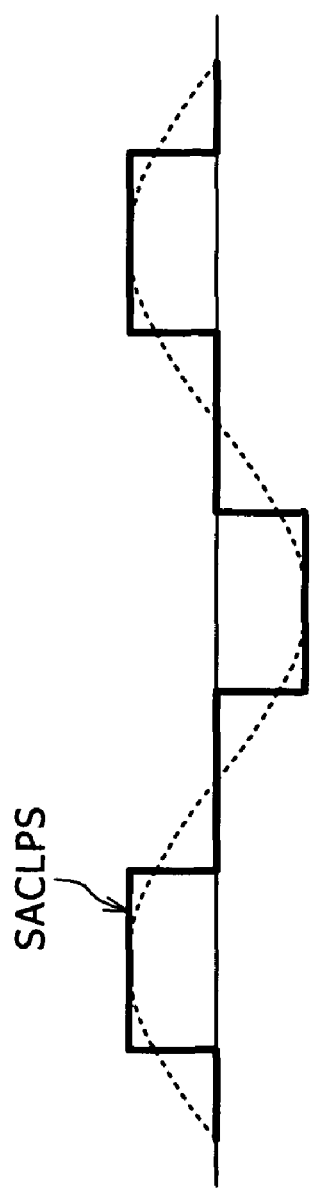

AC LINE SIGNAL DETECTION DEVICE AND METHOD AND POWER SUPPLY DEVICE

BACKGROUND OF THE INVENTION

1. Field of the Invention

The present invention relates to an AC line signal detection device and method and power source device for detecting an anomalous waveform of an AC line signal in the event of a loss of power supplied from an AC line to electronic equipment.

2. Description of the Related Art

An existing AC line signal detection device compares a signal, obtained by full-wave rectification of an AC line signal, with a given reference signal to convert the AC line signal to a pulse signal. Such a detector monitors the presence or absence of a pulse signal to detect the presence or absence of power supplied from the AC line.

SUMMARY OF THE INVENTION

In the case of an existing AC line signal detection device, the pulse signal converted from the signal obtained by full-wave rectification of an AC line signal has a period half that of an AC line signal when power is properly supplied from the AC line.

Therefore, it takes at least half the period of the AC line signal before it is determined that an anomaly has occurred after a loss of power supplied from the AC line.

It is an aim of the present invention to provide an AC line signal detection device and method and power source device capable of accurately and quickly detecting an anomalous waveform of an AC line signal in the event of a loss of power supplied from an AC line to electronic equipment.

An AC line signal detection device according to a first mode of the present invention includes a semiconductor integrated circuit and a conversion section adapted to rectify an AC line signal and convert the rectified signal to an input signal to be fed to the semiconductor integrated circuit. The semiconductor integrated circuit includes a monitoring section, measuring section and determination section. The monitoring section divides the AC line signal into a plurality of voltage ranges with at least one reference voltage proportional to the amplitude of the AC line signal to monitor within which voltage range the AC line signal falls. The measuring section measures a duration for which the AC line signal remains in each of the voltage ranges. The determination section determines, based on the monitoring result of the monitoring section and the measurement result of the measuring section, whether the duration for which the AC line signal remains in each of the voltage ranges exceeds a set time which can be set in advance to make a pass/fail determination on the AC line signal.

An AC line signal detection method according to a second mode of the present invention includes a first step of generating at least one reference voltage based on an input signal to be fed to a semiconductor integrated circuit. The input signal is obtained by rectifying an AC line signal and converting the rectified signal. The reference voltage is proportional to the amplitude of the AC line signal. The AC line signal detection method further includes a second step of dividing a half wave of the AC line signal into a plurality of voltage ranges with the reference voltage to monitor within which voltage range the AC line signal falls. The AC line signal detection method still further includes a third step of measuring a duration for which the AC line signal remains in each of the voltage ranges. The AC line signal detection method still further includes a fourth step of determining whether the duration for which the AC line signal remains in each of the voltage ranges exceeds a set time which can be set in advance to make a pass/fail determination on the AC line signal.

A power supply device according to a third mode of the present invention includes first and second converters. The first converter receives an AC line signal and converts it to a first DC voltage. The second converter converts the first DC voltage to a second DC voltage and supplies the second DC voltage to electronic equipment. The first converter includes a semiconductor integrated circuit and a conversion section adapted to rectify an AC line signal and convert the rectified signal to an input signal to be fed to the semiconductor integrated circuit. The semiconductor integrated circuit includes a monitoring section, measuring section and determination section. The monitoring section divides the AC line signal into a plurality of voltage ranges with at least one reference voltage proportional to the amplitude of the AC line signal to monitor within which voltage range the AC line signal falls. The measuring section measures a duration for which the AC line signal remains in each of the voltage ranges. The determination section determines, based on the monitoring result of the monitoring section and the measurement result of the measuring section, whether the duration for which the AC line signal remains in each of the voltage ranges exceeds a set time which can be set in advance to make a pass/fail determination on the AC line signal. The determination section also outputs a detection signal to the electronic equipment.

The embodiment of the present invention allows for accurate and quick detection of an anomalous waveform of an AC line signal in the event of a loss of power supplied from an AC line to electronic equipment.

BRIEF DESCRIPTION OF THE DRAWINGS

FIGS. 2A and 2B are diagrams for describing an AC line signal to be detected;

DETAILED DESCRIPTION OF THE PREFERRED EMBODIMENT

A description will be given below of an embodiment of the present invention with reference to the accompanying drawings. It should be noted that the description will be given in the following order:
1. Outline of the overall configuration of the power supply device
2. Configuration example of the AC line signal detection device
3. Modification example

1. Outline of the Overall Configuration of the Power Supply Device

Figure 1:
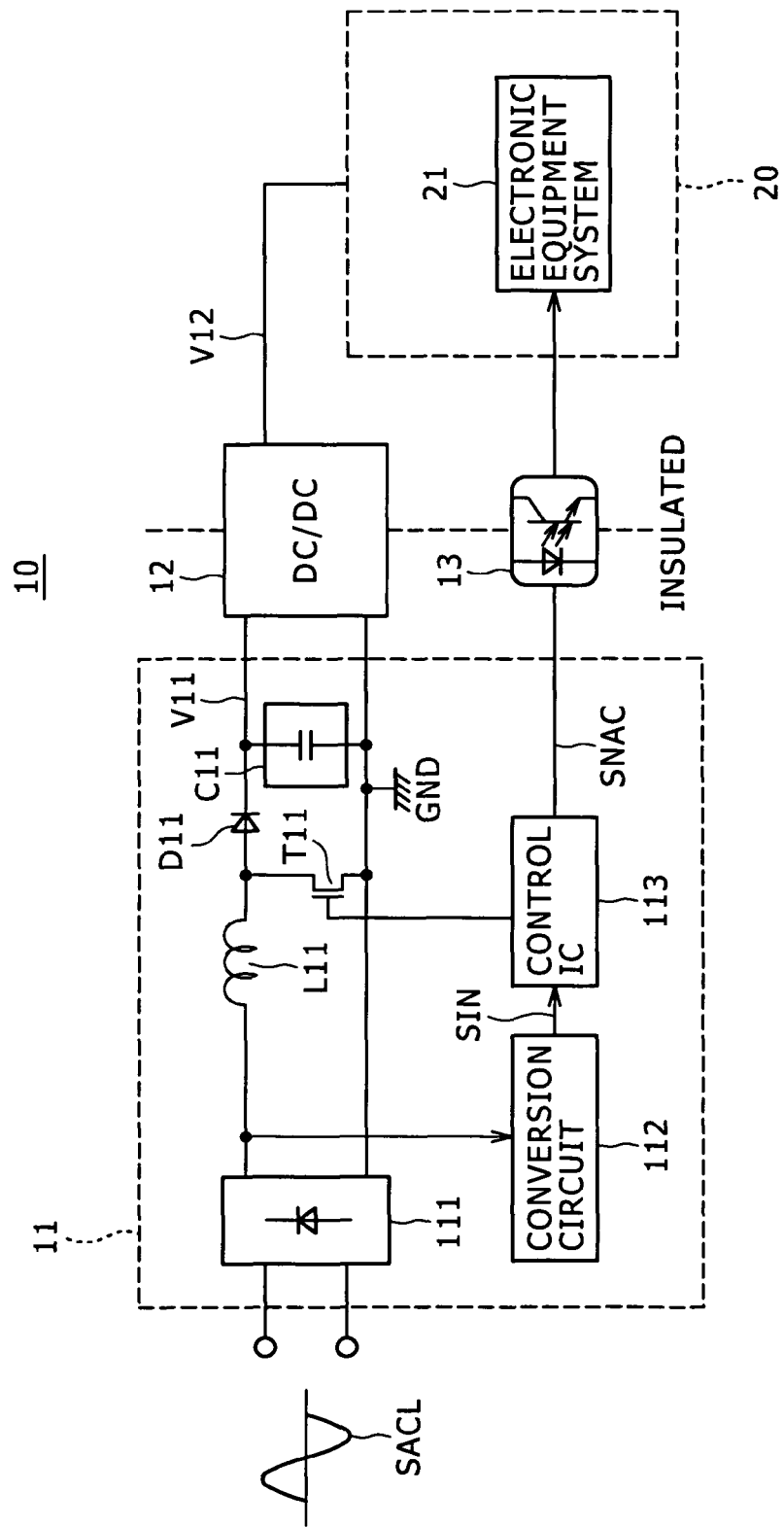
FIG. 1 is a diagram illustrating the outline of a power supply device of electronic equipment according to an embodiment of the present invention which is supplied with power from an AC line.

FIG. 1 is a diagram illustrating the outline of a power supply device of electronic equipment according to an embodiment of the present invention which is supplied with power from an AC line.

A power supply device 10 according to the present embodiment is used for electronic equipment 20. The electronic equipment 20 is supplied with power from an AC line such as home outlet (commercial power supply).

A gaming machine or television set, for example, corresponds to the electronic equipment 20.

The power supply device 10 includes an AC/DC converter 11 as a first converter, a DC/DC converter 12 as a second converter and a photocoupler 13.

The AC/DC converter 11 includes a rectifying circuit 111, conversion circuit 112, control circuit (control IC) 113, inductor L11, blocking capacitor C11, diode D11 and switching transistor T11.

In the power supply device 10, an AC line signal SACL supplied from the AC line is converted to an AC/DC converter output voltage V11, i.e., a first DC voltage of approximately 400 V, by the AC/DC converter 11.

The output voltage V11 is further converted to a second DC voltage V12 desired for the electronic equipment 20 such as a 12 V voltage by the insulated DC/DC converter 12 for distribution.

A PFC (Power Factor Correction) converter, for example, is used as the AC/DC converter 11. This PFC converter is controlled by the control IC 113.

The control IC 113 has the functionality to control the above voltage conversion by driving the switching transistor T11 and controlling the PFC.

The control IC 113 according to the present embodiment includes the rectifying circuit 111 and conversion circuit 112 and has an AC line signal detection function to accurately and quickly detect an anomalous waveform of the AC line signal SACL in the event of a loss of power supplied from the AC line to the electronic equipment 20.

The control IC 113 has the AC line signal detection function for the following reason:

That is, if the power from the AC line is interrupted, for example, because of the removal of the power plug from the AC outlet, the power supply device 10 has to continue to supply power to the electronic equipment 20 until an electronic equipment system 21 completes its shutdown process.

This power is furnished by the blocking capacitor C11 of the AC/DC converter 11.

However, the blocking capacitor C11 accounts for a large proportion of the components making up the power supply device 10 in terms of size and cost. As a result, the capacitance of the blocking capacitor C11 should desirably be reduced.

In order to reduce the capacitance of the blocking capacitor C11, a loss of AC power (interruption of the AC line signal) has to be quickly detected so as to shorten the time it takes before the system 21 of the electronic equipment 20 initiates its shutdown process.

This is the reason why the AC/DC converter 11 according to the present embodiment has the AC line signal detection function to accurately and quickly detect an anomalous waveform of the AC line signal SACL in the event of a loss of power supplied from the AC line.

Thus, the AC line signal detection function according to the present embodiment can be considered as one of the functions of the control IC 113 of the PFC converter.

More specifically, the AC line signal SACL is first rectified by the rectifying circuit 111. Next, the rectified signal is converted to an input signal SIN in such a manner as to fit into the input range of the control IC 113. The input signal SIN is processed by the control IC 113 to generate an AC loss detection signal SNAC.

The AC loss detection signal SNAC is insulated by the photocoupler 13 and transmitted to the system 21 of the electronic equipment 20.

Upon receipt of the AC loss detection signal SNAC, the system 21 of the electronic equipment 20 can inform the control IC 113 of the current status, completion of the shutdown process and other information via an unshown insulating photocoupler.

Here, the fact that the control IC 113 of the PFC converter has the AC line signal detection function is advantageous in that the input signal SIN used for AC line signal detection can also be used for other functions relating to controlling the PFC.

The following are examples of the functions:

The first function is composed of controlling the activation and deactivation of the PFC converter based on the input voltage level of the AC line signal SACL.

The second function is composed of ensuring that the power limitation on the PFC converter operating in continuous conduction mode is proportional to the inverse square of the input voltage level of the AC line signal SACL.

The input signal SIN used for AC line signal detection can also be used for these functions relating to controlling the PFC converter.

Further, the AC line signal detection function can be incorporated in a dedicated IC.

[AC Line Signal to be Detected]

FIGS. 2A and 2B are diagrams for describing an AC line signal to be detected.

In the present embodiment, a worldwide AC line signal is subject to a pass/fail determination. That is, an AC line signal SACLS having a sinusoidal waveform as shown in FIG. 2A is subject to a pass/fail determination. The same signal SACLS ranges in voltage from 85 V to 264 V and in frequency from 47 Hz to 63 Hz.

The AC line signal assumed for the power supply system which is designed with a margin to allow for electronic equipment to operate in a voltage or frequency range wider than that of the worldwide AC line signal may also be subject to detection.

Further, a signal SACLPS having a pseudo-sinusoidal waveform as shown in FIG. 2B may also be subject to detection. The same signal SACLPS is designed to supply power from a source other than home outlet.

2. Configuration Example of the AC Line Signal Detection Device

Figure 3:
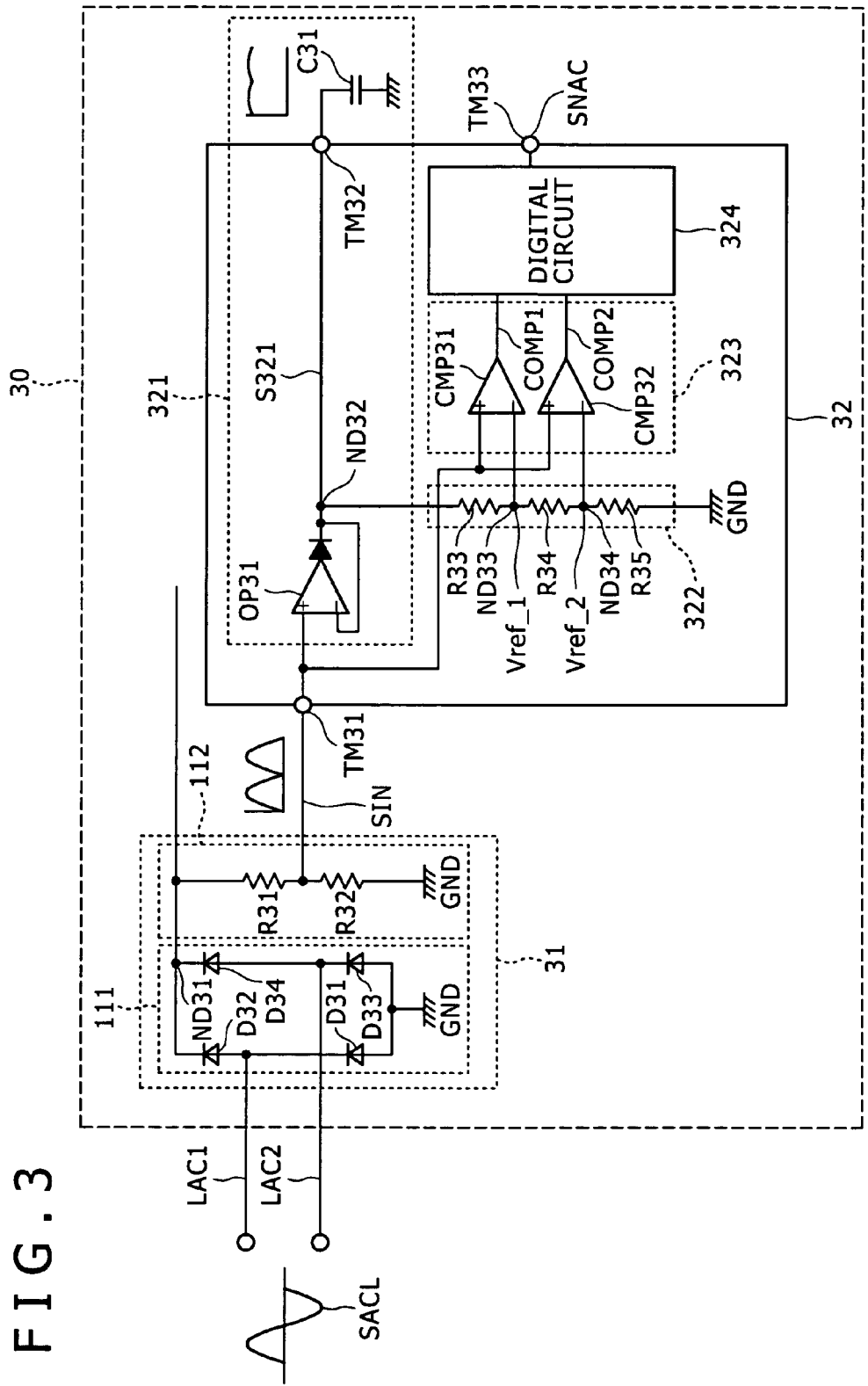
FIG. 3 is a diagram illustrating a specific configuration example of an AC line signal detection device according to the present embodiment.
Figure 4A:
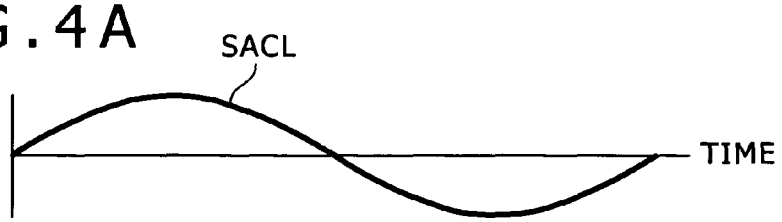
FIGS. 4A to 4D are diagrams illustrating the relationship between the AC line signal, an input signal, a peak hold signal, reference voltages and divided voltage ranges.
Figure 4B:
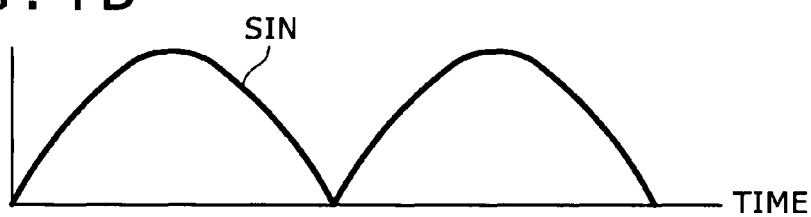
Figure 4C:
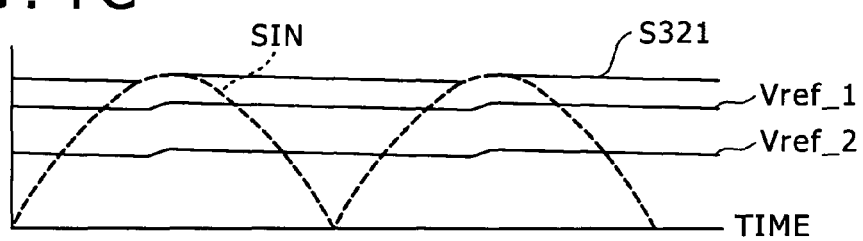
Figure 4D:
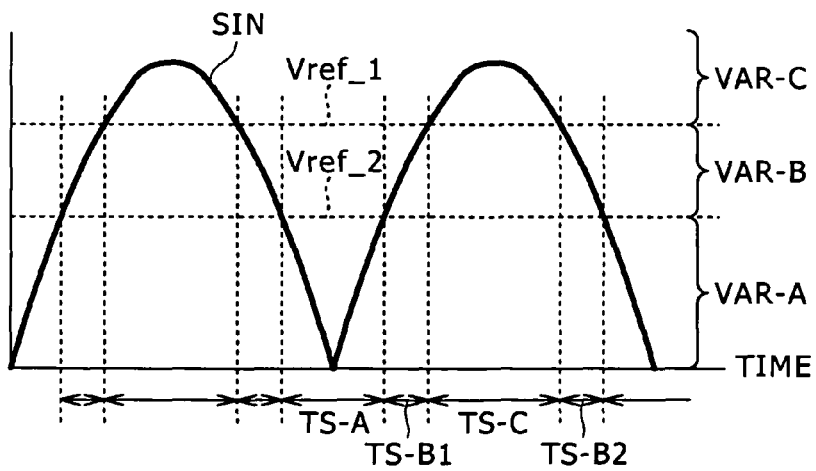

FIG. 3 is a diagram illustrating a specific configuration example of the AC line signal detection device according to the present embodiment.

An AC line signal detection device 30 shown in FIG. 3 includes a conversion section 31 and semiconductor integrated circuit (control IC or control section) 32.

The conversion section 31 includes the rectifying circuit 111 and conversion circuit 112.

The semiconductor integrated circuit 32 corresponds to the control IC 113 shown in FIG. 1.

The rectifying circuit 111 rectifies the AC line signal SACL transmitted over AC lines LAC1 and LAC2 and supplies a rectified signal S111 to the conversion circuit 112.

The rectifying circuit 111 shown in FIG. 3 full-wave-rectifies the AC line signal SACL.

The rectifying circuit 111 includes four diodes D31 to D34 and an output node ND31.

The diodes D31 and D32 are connected in series between ground GND, i.e., reference potential, and the output node ND31. The diodes D31 and D32 are connected so as to be forward-biased from the ground GND.

The connection node between the cathode of the diode D31 and the anode of the diode D32 is connected to the AC line LAC1.

Similarly, the diodes D33 and D34 are connected in series between the ground GND, i.e., reference potential, and the output node ND31. The diodes D33 and D34 are connected so as to be forward-biased from the ground GND.

The connection node between the cathode of the diode D33 and the anode of the diode D34 is connected to the AC line LAC2.

The conversion circuit 112 converts the rectified signal S111, rectified by the rectifying circuit 111, to the input signal SIN having a level falling within the input range of the semiconductor integrated circuit 32 and to be fed to the semiconductor integrated circuit 32, allowing the converted input signal SIN to be fed to the semiconductor integrated circuit 32.

The conversion circuit 112 shown in FIG. 3 includes resistive elements R31 and R32 connected in series between the output line of the rectified signal S111 of the rectifying circuit 111 and the ground GND.

The same circuit 112 divides the resistance (voltage) of the rectified signal S111 with the resistive elements R31 and R32 to convert the same signal S111 to the input signal SIN.

The semiconductor integrated circuit 32 has the functionality to generate at least one reference voltage Vref-n (n: integer equal to or greater than 1) from the input signal SIN converted by the conversion section 31. The reference voltage Vref-n is proportional in amplitude to the AC line signal SACL.

The same circuit 32 has a monitoring function which divides a half wave of the AC line signal SACL into a plurality of voltage ranges VAR-m (m: integer equal to or greater than 2) with the generated reference voltage Vref-n to constantly monitor within which voltage range VAR-m the AC line signal SACL falls.

The same circuit 32 has a measuring function together with the monitoring function. The measuring function measures a duration TS for which the AC line signal SACL remains in each of the voltage ranges VAR-n.

The same circuit 32 has a determination function adapted to make a pass/fail determination on the AC line signal SACL by means of the monitoring and measuring functions.

The determination function of the semiconductor integrated circuit 32 determines that a loss of AC power has occurred (AC line signal has been interrupted) if the same signal SACL does not make a transition to the next voltage range even when the duration TS exceeds a set time which can be set in advance. In this case, the determination function outputs the AC loss detection signal SNAC.

A peak hold circuit 321, reference voltage generating circuit 322, comparison section 323 and digital circuit 324 serving as a determination section are integrated within the semiconductor integrated circuit 32 shown in FIG. 3.

The same circuit 32 has terminals TM31, TM32 and TM33.

In the semiconductor integrated circuit 32 shown in FIG. 3, the monitoring section is made up of the peak hold circuit 321, reference voltage generating circuit 322 and comparison section 323.

Upon receipt of the input signal SIN, the peak hold circuit 321 holds the peak of the same signal SIN to generate the reference voltage Vref-n which is proportional in amplitude to the AC line signal SACL. The peak hold circuit 321 supplies a peak hold signal S321 to the reference voltage generating circuit 322.

The peak hold circuit 321 shown in FIG. 3 includes an operational amplifier (op-amp) OP31, holding capacitor C31 and node ND32.

The op-amp OP31 has its non-inverted input terminal (+) connected to the terminal TM31 and its output connected to the node ND32. The input signal SIN is supplied to the terminal TM31.

The cathode of the diode D35 and the inverted input terminal (−) of the op-amp OP31 are connected to the node ND32.

The node ND32 is connected to the terminal TM32 which is connected to the external capacitor C31.

The reference voltage generating circuit 322 generates a plurality (two in the present example or n=2) of reference voltages Vref-1 and Vref-2 from the peak hold signal S321 in which the peak of the input signal SIN has been held. The same circuit 322 supplies the generated reference voltages to the comparison section 323.

The reference voltage generating circuit 322 shown in FIG. 3 includes resistive elements R33, R34 and R35 connected in series between the supply line of the peak hold signal S321 and the ground GND.

The same circuit 322 generates the reference voltage Vref-1 at a connection node ND33 between the resistive elements R33 and R34.

The same circuit 322 generates the reference voltage Vref-2 at a connection node ND34 between the resistive elements R34 and R35.

The reference voltage Vref-1 is generated to be about 80% of the peak level (highest level) of the input signal SIN.

The reference voltage Vref-2 is generated to be about 50% of the peak level (highest level) of the input signal SIN.

The comparison section 323 divides a half wave of the AC line signal SACL by the reference voltages Vref-1 and Vref-2 into the plurality of voltage ranges VAR-m (m: 3 in the present example) to constantly monitor within which of voltage ranges VAR-A, VAR-B and VAR-C the AC line signal SACL falls.

FIGS. 4A to 4D are diagrams illustrating the relationship between the AC line signal, input signal, peak hold signal, reference voltages and divided voltage ranges.

As illustrated in FIGS. 4A to 4D, the input signal SIN can be divided by the reference voltages Vref-1 and Vref-2 into the voltage ranges VAR-A, VAR-B and VAR-C.

The input signal SIN is compared against the reference voltages Vref-1 and Vref-2 by comparators of the comparison section 323. This makes it possible to constantly monitor within which of the voltage ranges VAR-A, VAR-B and VAR-C the AC line signal SACL falls.

The comparison section 323 shown in FIG. 3 includes a plurality (two in the present example) of comparators CMP31 and CMP32 to constantly monitor within which of the voltage ranges VAR-A, VAR-B and VAR-C the AC line signal SACL falls.

The comparator CMP31 compares the input signal SIN and reference voltage Vref-1 and outputs the comparison result to the digital circuit 324 as a signal COMP1.

The comparator CMP31 monitors whether the AC line signal SACL is in the voltage range VAR-C or VAR-B based on the comparison between the input signal SIN and reference voltage Vref-1.

The comparator CMP32 compares the input signal SIN and reference voltage Vref-2 and outputs the comparison result to the digital circuit 324 as a signal COMP2.

The comparator CMP32 monitors whether the AC line signal SACL is in the voltage range VAR-B or VAR-A based on the comparison between the input signal SIN and reference voltage Vref-2.

The digital circuit 324 measures durations TS-A, TS-B and TS-C for which the AC line signal SACL remains respectively in the voltage ranges VAR-A, VAR-B and VAR-C based on the comparison results (monitoring results) of the monitoring function of the comparison section 323, thus making a pass/fail determination on the AC line signal SACL.

The same circuit 324 determines that the AC power has been lost (AC line signal has been interrupted) if the same signal SACL does not move to the next voltage range even when any of the durations TS-A to TS-C exceeds the predetermined set time. In this case, the same circuit 324 outputs the AC loss detection signal SNAC.

Figure 5:
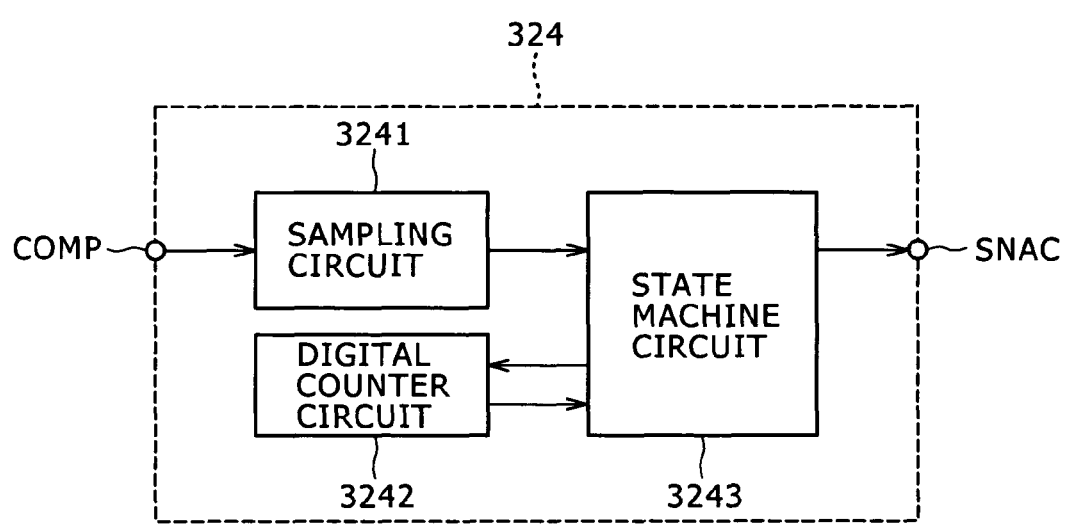
FIG. 5 is a block diagram illustrating a configuration example of a digital circuit according to the present embodiment.

FIG. 5 is a block diagram illustrating a configuration example of the digital circuit according to the present embodiment.

The digital circuit 324 shown in FIG. 5 includes a sampling circuit 3241, digital counter circuit 3242 and state machine circuit 3243.

The sampling circuit 3241 samples the output signals of the comparators CMP31 and CMP32 of the comparison section 323 and outputs the sampled signals to the state machine circuit 3243.

The sampling circuit 3241 commonly has a digital filter function. This function is designed to remove chatter from the output signals of the comparators using the sampling circuit 3241 assuming that noise is superposed on the AC line signal SACL.

The digital counter circuit 3242 measures durations TS-A, TS-B1, TS-C and TS-B2 for which the AC line signal SACL remains in the voltage ranges VAR-A, VAR-B and VAR-C and supplies the measurement results to the state machine circuit 3243.

The state machine circuit 3243 monitors within which voltage range the AC line signal SACL falls and compares the duration TS for which the same signal SACL remains in each of the voltage ranges against the predetermined time to make a pass/fail determination on the same signal SACL.

[Description of the Operation of the AC Line Signal Detection Device]

A description will be given next of the operation of the AC line signal detection device 30 with reference to FIGS. 6 to 9.

The AC line signal SACL is first rectified by the rectifying circuit 111 of the conversion section 31. Next, the rectified signal is converted, for example, by resistance division in such a manner as to fit into the input range of the semiconductor integrated circuit 32. The converted signal is fed to the semiconductor integrated circuit 32 as the input signal SIN.

In the semiconductor integrated circuit 32, the input signal SIN is converted by the peak hold circuit 321 to a signal whose DC level is proportional to the amplitude of the AC line signal SACL.

The reference voltage generating circuit 322 generates the two reference voltages Vref-1 and Vref-2 from the peak hold signal S321 with a held peak level.

The reference voltages Vref-1 and Vref-2 divide the input signal SIN into the three voltage ranges VAR-A, VAR-B and VAR-C as illustrated in FIG. 4.

Then, the comparators CMP31 and CMP32 of the comparison section 323 compare the input signal SIN respectively against the reference voltage Vref-1 and reference voltage Vref-2 to monitor within which of the voltage ranges VAR-A, VAR-B and VAR-C the AC line signal SACL falls.

The monitoring results (comparison results) of the comparison section 323 are supplied to the digital circuit 324.

In the digital circuit 324, the sampling circuit 3241 samples the output signals COMP1 and COMP2 of the comparators CMP31 and CMP32 and transmits the same signals COMP1 and COMP2 to the state machine circuit 3243.

The sampling circuit 3241 has a digital filter function. This function removes chatter from the comparator output signals COMP1 and COMP2 using the sampling circuit 3241 if noise is superposed on the AC line signal SACL.

Figure 6:
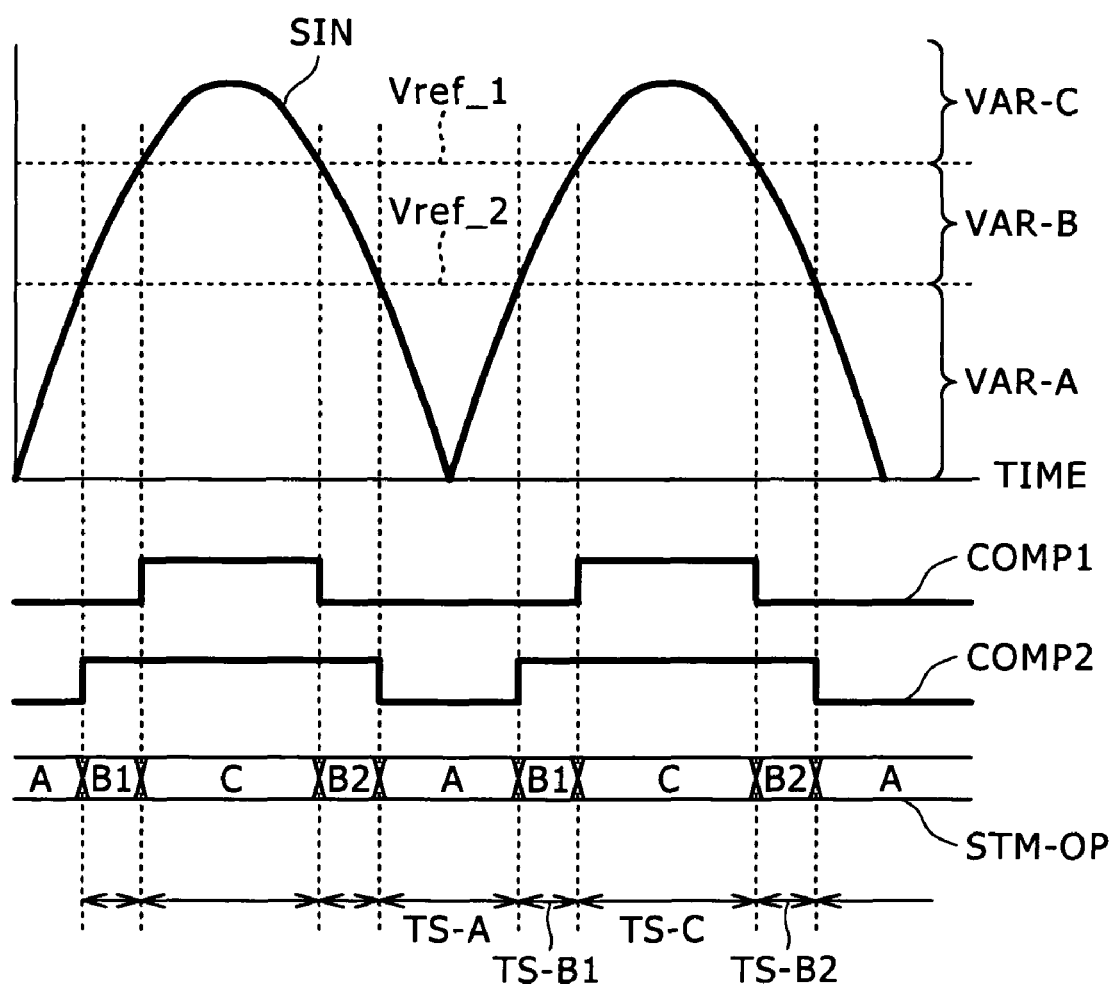
FIG. 6 is a timing diagram for describing a first operation of a state machine circuit.

FIG. 6 illustrates a timing diagram for describing the first operation of the state machine circuit.

Figure 7:
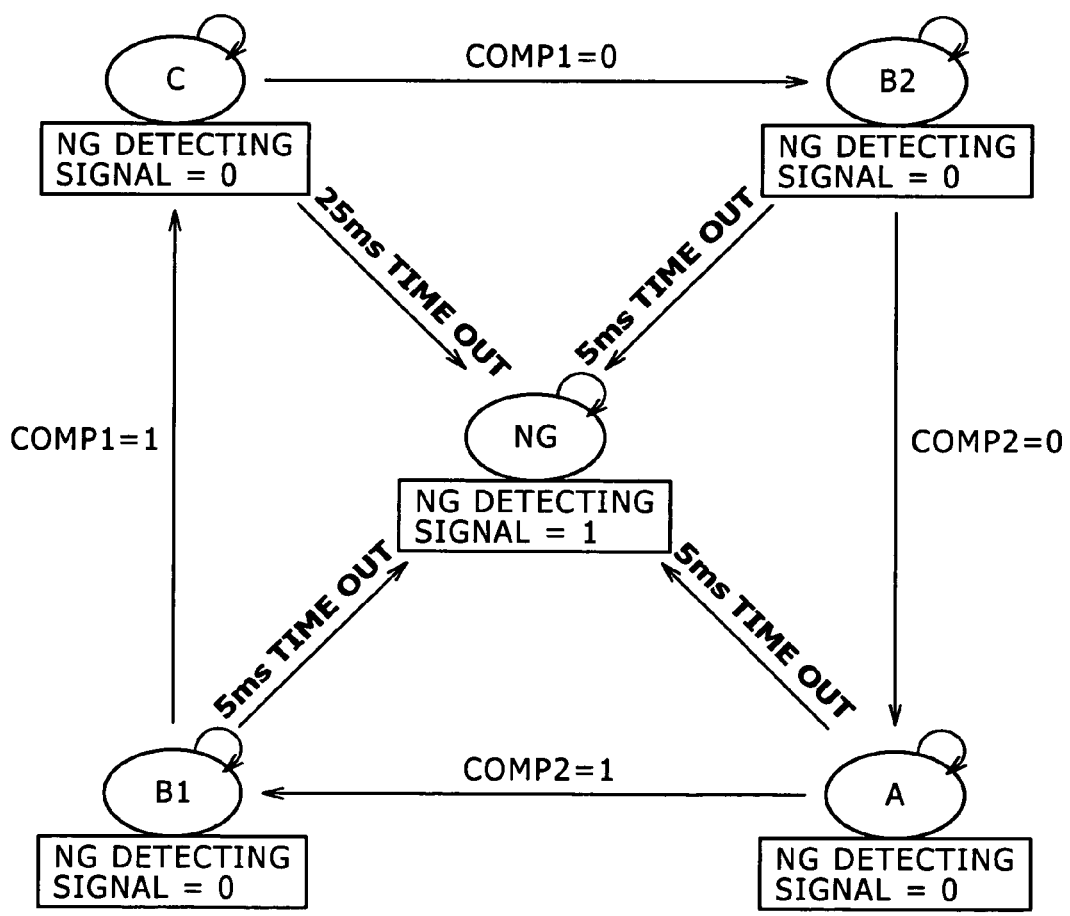
FIG. 7 is a diagram illustrating an example of state transition diagram representing the first operation of the state machine circuit.

FIG. 7 illustrates an example of state transition diagram representing the first operation of the state machine circuit.

In the present embodiment, the comparator CMP31 compares the input signal SIN and reference voltage Vref-1, and the comparator CMP32 the input signal SIN and reference voltage Vref-2, as described above.

The state machine circuit 3243 monitors the AC line signal SACL in the following manner:

When the output signal COMP1 of the comparator CMP31 is '0' and the output signal COMP2 of the comparator CMP32 is '0,' the AC line signal SACL falls within the voltage range VAR-A.

When the output signal COMP1 of the comparator CMP31 is '0' and the output signal COMP2 of the comparator CMP32 is '1,' the AC line signal SACL falls within the voltage range VAR-B.

When the output signal COMP1 of the comparator CMP31 is '1' and the output signal COMP2 of the comparator CMP32 is '1,' the AC line signal SACL falls within the voltage range VAR-C.

When the AC line signal SACL falls within the voltage range VAR-B, whether the same signal SACL will rise or fall is determined in the following manner:

That is, if the immediately previous state is the voltage range VAR-A, then the AC line signal SACL is determined to fall within a voltage range VAR-B1. If the immediately previous state is the voltage range VAR-C, then the same signal SACL is determined to fall within a voltage range VAR-B2.

If the AC line signal SACL is a normal sinusoidal wave, the input signal SIN has a rectified waveform as shown in FIG. 6. The state transitions from A to B1 to C to B2 back to A are repeated.

The digital counter circuit 3242 in the digital circuit 324 shown in FIG. 5 measures the durations TS-A, TS-B1, TS-C and TS-B2 for which the AC line signal SACL remains in each of the voltage ranges.

The maximum duration (timeout period) for which the AC line signal SACL is allowed to remain in each of the voltage ranges VAR-A, VAR-B1, VAR-C and VAR-B2 is set in advance. The state machine circuit 3243 compares the duration for which the AC line signal SACL has remained in each voltage range against the timeout period.

The operation of the state machine circuit 3243 can be explained as follows with reference to the state transition diagram in FIG. 7.

If the AC line signal SACL is a normal sinusoidal wave, the state transitions from A to B1 to C to B2 back to A are repeated.

At this time, the AC loss detection signal (fail detection signal) SNAC, i.e., output of the state machine circuit 3243, is '0' (not detected).

In the example shown in FIG. 7, the timeout periods for the respective voltage ranges are set as follows:

That is, the timeout period for the duration TS-A for the voltage range VAR-A is set to 5 ms.

The timeout period for the duration TS-B1 for the voltage range VAR-B1 is set to 5 ms.

The timeout period for the duration TS-C for the voltage range VAR-C is set to 25 ms.

The timeout period for the duration TS-B2 for the voltage range VAR-B2 is set to 8 ms.

If any of the duration TS-A, TS-B1, TS-C and TS-B2 respectively for the voltage ranges VAR-A, VAR-B1, VAR-C and VAR-B2 reaches its timeout period, the state machine circuit 3243 determines that the AC line signal SACL is anomalous.

As a result, the state machine circuit 3243 makes a transition to the fail state, setting the AC loss detection signal (fail detection signal) SNAC to '1' (detected).

A description will be given next of another example of the operation of the state machine circuit.

Figure 8:
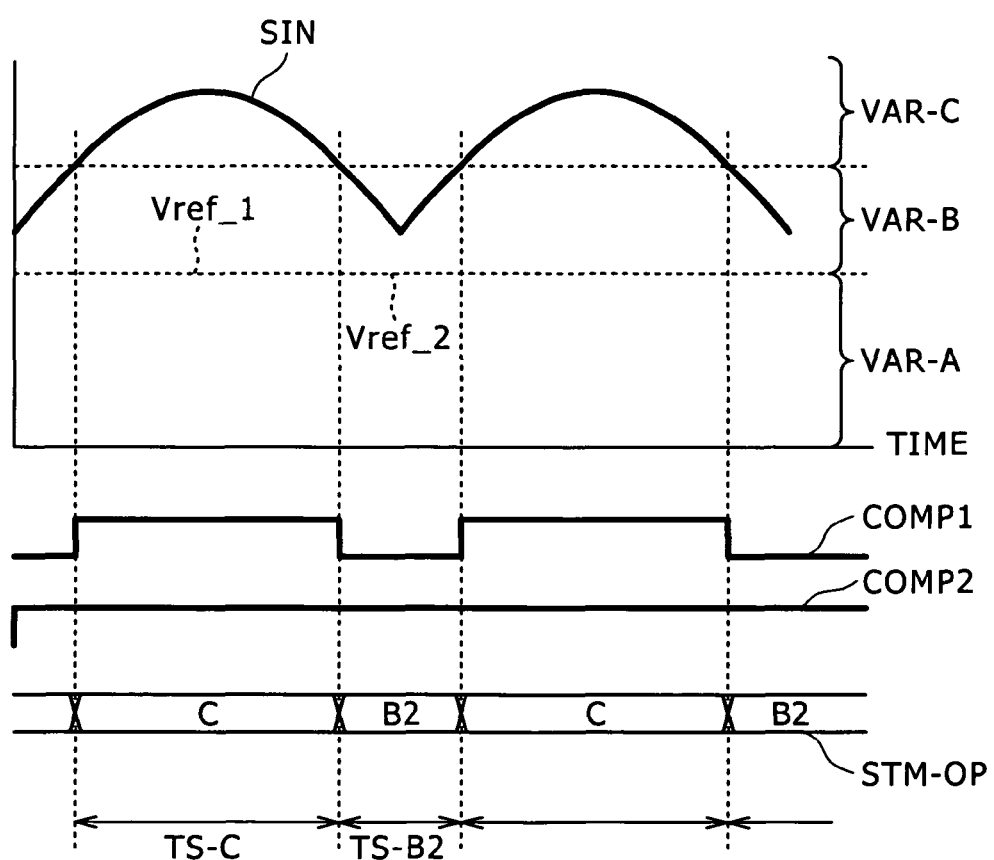
FIG. 8 is a timing diagram for describing a second operation of the state machine circuit.

FIG. 8 illustrates a timing diagram for describing a second operation of the state machine circuit.

Figure 9:
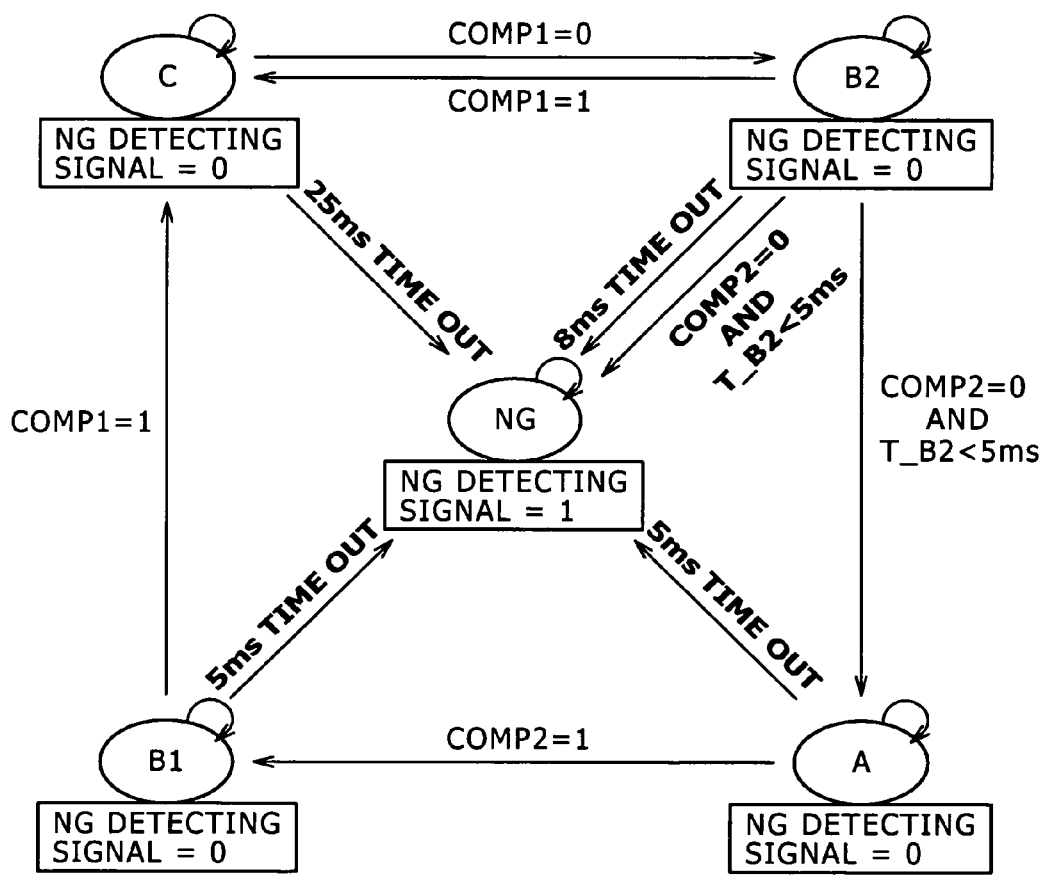
FIG. 9 is a diagram illustrating an example of state transition diagram representing the second operation of the state machine circuit.

FIG. 9 illustrates an example of state transition diagram representing the second operation of the state machine circuit.

In the presence of capacitance after the rectification of the AC line signal SACL or capacitance in the terminal of the input signal SIN or if the power supply device operates under conditions of low power consumption, the input signal to the IC may have a waveform with no voltage valleys rather than an ideal rectified waveform.

In this case, it is possible to assume that the voltage range VAR-A does not exist.

Therefore, the assumed state transitions are twofold. That is, in addition to the first type of state transitions from A to B1 to C to B2 back to A, the second type of state transitions from C to B2 back to C is also allowed.

A description will be given below of the operation of the state machine circuit designed with these two types of state transitions in mind.

In the second type of state transitions, the duration TS-B2 for which the AC line signal SACL remains in the voltage range VAR-B2 is longer than that in the first type of state transitions. As a result, unless the timeout period is set long, erroneous detection may occur.

Therefore, the timeout period for the duration TS-B2 for the voltage range VAR-B2 is set long (8 ms in the example shown in FIG. 9) assuming that the second type of state transitions will take place.

Further, in the event of a loss of AC power with the first type of state transitions while the AC line signal SACL remains in the voltage range VAR-B2, the following determination condition is added to output the fail detection signal as quickly as possible.

That is, if the duration TS-B2 for which the AC line signal SACL remains in the voltage range VAR-B2 is equal to or longer than a given period (5 ms) when the output signal COMP2 of the comparator CMP32 is '0,' the state machine circuit 3243 determines that a loss of AC power has occurred and outputs the AC loss detection signal (fail detection signal) SNAC.

Thus, the state machine circuit 3243 allows the set time to be set based on the monitoring results according to the manner in which the AC line signal makes transitions between the voltage ranges.

The state machine circuit operates basically as described above. Practically, however, this circuit can be customized in various ways including state transition at the time of initial activation and restoration to normal from the fail state.

3. Modification Example

A description will be given below of a modification example of the AC line signal detection device according to the present embodiment.

It is possible to assume that higher harmonic noise is superposed on the AC line signal to be detected. Therefore, the AC line signal detection device can include filters, one inserted between the AC line LAC1 and the rectifying circuit 111 and another between the AC line LAC2 and the rectifying circuit 111.

Similarly, the AC line signal detection device can include a filter provided at the input to the semiconductor integrated circuit (IC) 32. This filter is intended to remove noise from the input signal SIN.

The AC line signal detection device is applicable irrespective of whether the rectifying circuit is a full-wave or half-wave rectifying circuit.

The AC line signal detection device is applicable irrespective of whether the input signal SIN is a voltage or current input signal.

In the present embodiment, a case has been described in which the input signal SIN is a voltage input signal. However, even if the input signal SIN is a current input signal, the same process can be performed so long as a current/voltage converter is provided in the IC.

Figure 10:
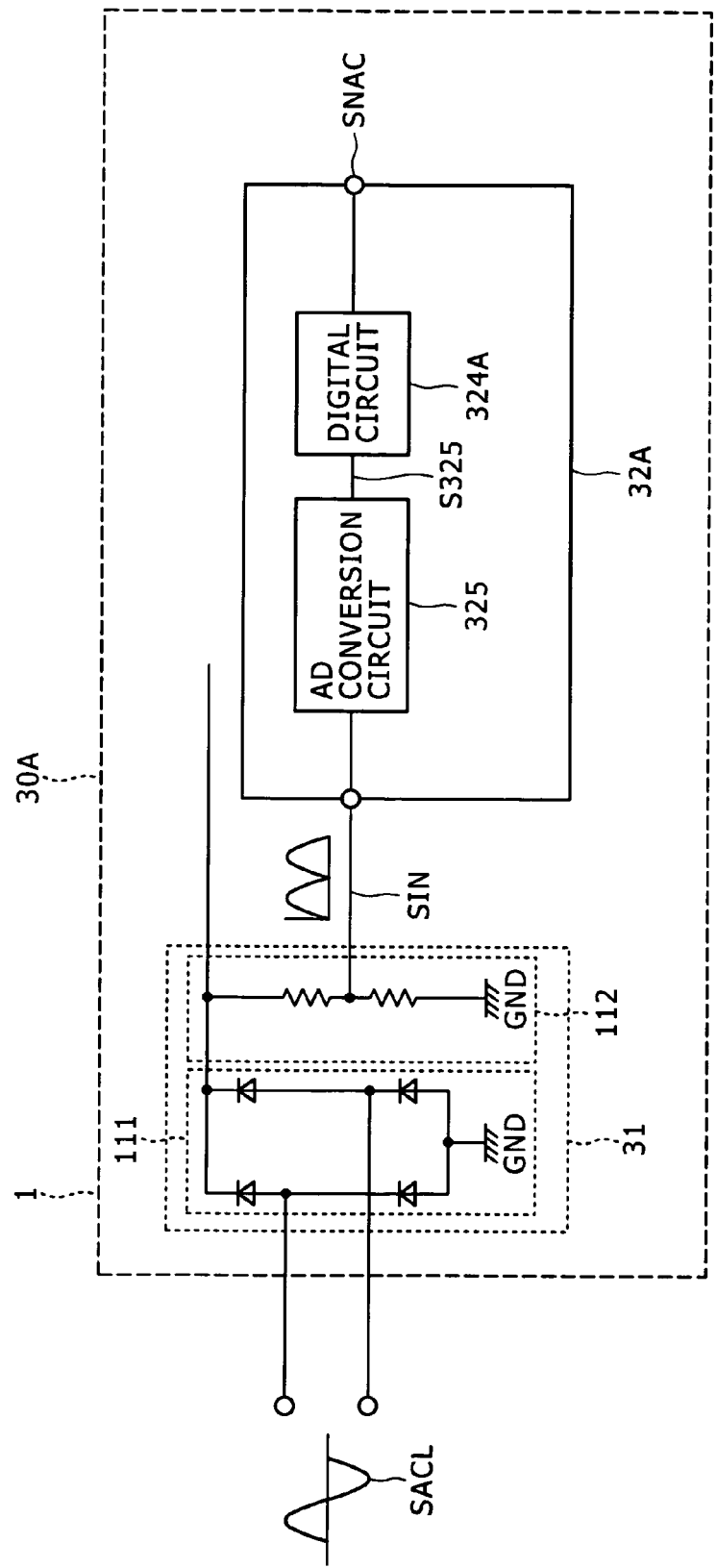
FIG. 10 is a diagram illustrating another configuration example of the AC line signal detection device.

FIG. 10 is a diagram illustrating another configuration example of the AC line signal detection device.

Figure 11:
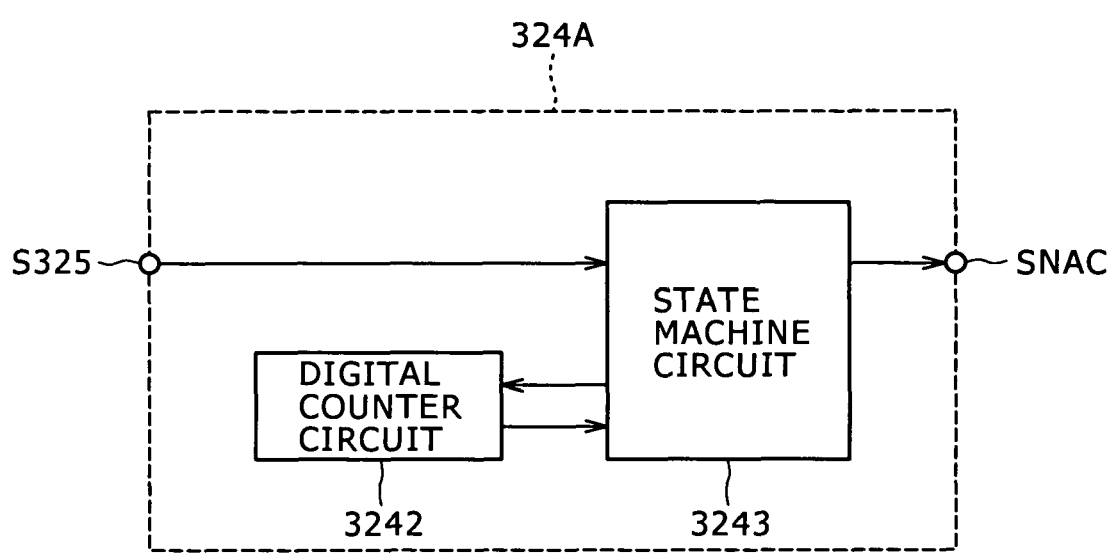
FIG. 11 is a diagram illustrating a configuration example of the digital circuit shown in FIG. 10.

FIG. 11 is a diagram illustrating a configuration example of the digital circuit shown in FIG. 10.

An AC line signal detection device 30A may be configured to receive the input signal SIN with an analog/digital (A/D) conversion circuit 325 as illustrated in FIG. 10 rather than with a peak hold circuit as illustrated in FIG. 3.

The A/D conversion circuit 325 serves as a monitoring section.

In this case, a digital circuit 324A does not need the sampling circuit shown in FIG. 5. As a result, the output of the A/D conversion circuit 325 is fed to the state machine circuit 3243.

As for the reference voltage Vref-n and voltage ranges VAR-m, shown in FIGS. 4A to 4D, if there is only one reference voltage, the AC line signal SACL is divided into two voltage ranges.

Therefore, the minimum required number of reference voltages is one.

In the present embodiment, two reference voltages are used. However, three or more reference voltages may also be used.

The present embodiment provides several-fold to several-ten-fold improvement in AC power loss detection speed.

Further, the present embodiment remains unaffected even by a worldwide AC input (85 V to 264 V), providing constant speed and accuracy in AC power loss detection.

As a result, if the supply of power from the AC line is interrupted, for example, because of the removal of the power plug from the AC outlet, AC power loss can be detected quickly, thus shortening the time it takes before the electronic equipment system initiates its shutdown process.

This makes it possible to reduce the capacitance of the blocking capacitor C11 adapted to continue to supply power to the electronic equipment 20 until the system 21 of the electronic equipment 20 completes its shutdown process.

The present application contains subject matter related to that disclosed in Japanese Priority Patent Application JP 2009-113888 filed in the Japan Patent Office on May 8, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. An alternating-current line signal detection device comprising:
    a semiconductor integrated circuit; and
    a conversion section adapted to rectify an alternating-current line signal and convert the rectified signal to an input signal to be fed to the semiconductor integrated circuit, wherein
    the semiconductor integrated circuit includes
        a monitoring section adapted to divide the alternating-current line signal into a plurality of voltage ranges with at least one reference voltage proportional to the amplitude of the alternating-current line signal to monitor within which voltage range the alternating-current line signal falls,
        a measuring section adapted to measure a duration for which the alternating-current line signal remains in each of the voltage ranges, and
        a determination section adapted to determine, based on the monitoring result of the monitoring section and the measurement result of the measuring section, whether the duration for which the alternating-current line signal remains in each of the voltage ranges exceeds a set time which can be set in advance to make a pass/fail determination on the alternating-current line signal.

2. The alternating-current line signal detection device of claim 1, wherein
    the determination section determines that the alternating-current line signal has been interrupted if the alternating-current line signal does not make a transition to the next voltage range even when the duration exceeds the set time, and outputs a detection signal.

3. The alternating-current line signal detection device of claim 1, wherein
    the determination section allows the set time to be set based on the monitoring results of the monitoring section according to the manner in which the alternating-current line signal makes transitions between the voltage ranges.

4. The alternating-current line signal detection device of claim 1, wherein
    the monitoring section comprises:
        a reference voltage generating section adapted to generate at least one reference voltage proportional to the amplitude of the alternating-current line signal based on the input signal converted by the conversion section; and
        a comparison section including at least one comparator adapted to compare the reference voltage and input signal to divide a half wave of the alternating-current line signal into a plurality of voltage ranges with the reference voltage generated by the reference voltage generating section so as to monitor within which voltage range the alternating-current line signal falls.

5. The alternating-current line signal detection device of claim 4, wherein
    the monitoring section comprises
    a peak hold section adapted to hold the peak of the input signal to generate a reference voltage proportional to the amplitude of the alternating-current line signal, and
    the reference voltage generating section generates the reference voltage from a peak hold signal of the peak hold section.

6. The alternating-current line signal detection device of claim 5, wherein
    the reference voltage generating section generates two or more reference voltages from the peak hold signal.

7. The alternating-current line signal detection device of claim 6, wherein
    the comparison section comprises
    a plurality of comparators equivalent in number to the number of reference voltages generated, and
    each of the plurality of comparators compares the input signal and one of the different reference voltages.

8. The alternating-current line signal detection device of claim 1, wherein
    the determination section comprises
    a digital circuit including the measuring section.

9. The alternating-current line signal detection device of claim 8, wherein
    the digital circuit comprises
    a sampling circuit adapted to sample output signals of the comparators of the comparison section.

10. The alternating-current line signal detection device of claim 8, wherein
    the digital circuit comprises
    a digital counter circuit serving as the measuring section adapted to measure a duration for which the alternating-current line signal remains in each of the voltage ranges.

11. The alternating-current line signal detection device of claim 8, wherein
    the digital circuit comprises
    a state machine circuit adapted to detect within which voltage range the alternating-current line signal falls and compare a duration for which the alternating-current line signal remains in each of the voltage ranges against the set time to make a pass/fail determination on the alternating-current line signal.

12. The alternating-current line signal detection device of claim 1, wherein
    the monitoring section comprises
    an analog/digital (A/D) conversion circuit adapted to convert the input signal to a digital signal.

13. The alternating-current line signal detection device of claim 12, wherein
    the digital circuit comprises
    a digital counter circuit serving as the measuring section adapted to measure a duration for which the alternating-current line signal remains in each of the voltage ranges.

14. The alternating-current line signal detection device of claim 12, wherein
    the digital circuit comprises
    a state machine circuit adapted to detect within which voltage range the alternating-current line signal falls and compare a duration for which the alternating-current line signal remains in each of the voltage ranges against the set time to make a pass/fail determination on the alternating-current line signal.

15. An alternating-current line signal detection method comprising the steps of:
generating at least one reference voltage based on an input signal, obtained by rectifying an alternating-current line signal and converting the rectified signal, so as to feed the reference voltage to a semiconductor integrated circuit, the reference voltage being proportional to the amplitude of the alternating-current line signal;
dividing a half wave of the alternating-current line signal into a plurality of voltage ranges with the reference voltage to monitor within which voltage range the alternating-current line signal falls;
measuring a duration for which the alternating-current line signal remains in each of the voltage ranges; and
determining whether the duration for which the alternating-current line signal remains in each of the voltage ranges exceeds a set time which can be set in advance to make a pass/fail determination on the alternating-current line signal.

16. The alternating-current line signal detection method of claim 15, wherein
the fourth step determines that the alternating-current line signal has been interrupted if the alternating-current line signal does not make a transition to the next voltage range even when the duration exceeds the set time, and outputs a detection signal.

17. The alternating-current line signal detection method of claim 15, wherein
the fourth step sets the set time based on the monitoring results according to the manner in which the alternating-current line signal makes transitions between the voltage ranges.

18. A power supply device comprising:
a first converter adapted to receive an alternating-current line signal and convert the alternating-current line signal to a first direct-current voltage; and
a second converter adapted to convert the first direct-current voltage of the first converter to a second direct-current voltage and supply the second direct-current voltage to electronic equipment, wherein
the first converter includes
a semiconductor integrated circuit, and
a conversion section adapted to rectify an alternating-current line signal and convert the rectified signal to an input signal to be fed to the semiconductor integrated circuit,
the semiconductor integrated circuit includes
a monitoring section adapted to divide the alternating-current line signal into a plurality of voltage ranges with at least one reference voltage proportional to the amplitude of the alternating-current line signal to monitor within which voltage range the alternating-current line signal falls,
a measuring section adapted to measure a duration for which the alternating-current line signal remains in each of the voltage ranges, and
a determination section adapted to determine, based on the monitoring result of the monitoring section and the measurement result of the measuring section, whether the duration for which the alternating-current line signal remains in each of the voltage ranges exceeds a set time which can be set in advance to make a pass/fail determination on the alternating-current line signal, and output a detection signal to the electronic equipment.

* * * * *